United States Patent
Jeong

(10) Patent No.: US 7,379,372 B2
(45) Date of Patent: May 27, 2008

(54) NON-VOLATILE MEMORY DEVICE WITH SCANNING CIRCUIT AND METHOD

(75) Inventor: Jae-Yong Jeong, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 158 days.

(21) Appl. No.: 11/181,163

(22) Filed: Jul. 13, 2005

(65) Prior Publication Data

US 2006/0056237 A1    Mar. 16, 2006

Related U.S. Application Data

(63) Continuation-in-part of application No. 10/982,560, filed on Nov. 5, 2004.

(30) Foreign Application Priority Data

Sep. 15, 2004   (KR) .................... 10-2004-0073883

(51) Int. Cl.
   *G11C 5/14*   (2006.01)
(52) U.S. Cl. .................... 365/226; 365/185.28; 365/49
(58) Field of Classification Search ............... 365/226, 365/185.28, 49, 185.22, 185.14, 185.23
   See application file for complete search history.

(56) References Cited

U.S. PATENT DOCUMENTS

| | | | |
|---|---|---|---|
| 6,643,193 B2* | 11/2003 | Yamaki et al. ......... | 365/189.09 |
| 6,687,158 B2 | 2/2004 | Yano | |
| 6,721,207 B2* | 4/2004 | Tsujikawa et al. ..... | 365/185.28 |
| 6,845,041 B2* | 1/2005 | Lee ........................ | 365/185.17 |
| 6,937,524 B2 | 8/2005 | Shiga et al. | |
| 7,031,192 B1* | 4/2006 | Park et al. ............. | 365/185.22 |
| 7,161,839 B2* | 1/2007 | Im ......................... | 365/185.28 |
| 2002/0122347 A1 | 9/2002 | Frulio et al. | |
| 2004/0145947 A1* | 7/2004 | Micheloni et al. ...... | 365/185.19 |
| 2006/0004970 A1* | 1/2006 | Jeong et al. ................ | 711/154 |
| 2006/0077720 A1* | 4/2006 | Im ......................... | 365/185.28 |

FOREIGN PATENT DOCUMENTS

| | | |
|---|---|---|
| JP | 10-289592 | 10/1998 |
| KR | 1998-071571 | 10/1998 |
| KR | 1999-012428 | 2/1999 |
| KR | 1999-0064138 | 7/1999 |
| KR | 2004-0059458 | 7/2004 |

OTHER PUBLICATIONS

English language abstract of the Korean Publication No. 1999-012428.
English language abstract of the Korean Publication No. 2004-0059458.

* cited by examiner

Primary Examiner—Richard T. Elms
Assistant Examiner—Dang Nguyen
(74) Attorney, Agent, or Firm—Marger Johnson & McCollom, P.C.

(57) ABSTRACT

An accelerated bit scanning nonvolatile memory device and method. A nonvolatile memory device including a memory cell array including a plurality of memory cells, each memory cell corresponding to program data, a data scanning unit to detect the program data having a first value, and a programming unit to program the memory cells corresponding to the detected portions of the program data responsive to the scanning.

23 Claims, 7 Drawing Sheets

NON-VOLATILE MEMORY DEVICE WITH SCANNING CIRCUIT AND METHOD

CROSS-REFERENCE TO RELATED APPLICATIONS

This application claims priority under 35 USC § 119 to Korean Patent Application No. 2004-73883 filed on Sep. 15, 2004, which we incorporate by reference. This application is also a continuation-in-part of co-pending U.S. patent application Ser. No. 10/982,560 filed on Nov. 5, 2004, which claimed priority from Korean Patent Application No. 10-2004-0052076 filed on Jul. 5, 2004, which are commonly assigned to SAMSUNG ELECTRONICS CO., LTD.

FIELD OF THE INVENTION

The invention relates to a nonvolatile memory device and, more specifically, to a nonvolatile memory device with an improved scanning circuit and method.

BACKGROUND OF THE INVENTION

Nonvolatile memory devices maintain stored data in memory cells when its power supply is cut off. One type of nonvolatile memory widely used in computers, memory cards, and the like, for its ability to electronically erase and store data, is flash memory.

Flash memory is categorized as either NOR or NAND type according to their memory cell structure. The NOR type flash memory connects two or more memory cells in parallel to each bit line, while the NAND type flash memory serially connects two or more memory cells to each bit line. The NOR type flash memory stores, or programs, data to memory cells using channel hot electron injection and erases data stored in memory cells using Fowler-Nordheim tunneling (F-N tunneling). The NAND type flash memory both stores and erases data in memory cells using F-N tunneling. With channel hot electron injection implementation, the NOR type flash memory programs cells more quickly than NAND type flash memory. A trade-off to this improved performance is that the NOR type flash memory dissipates more memory cell current adversely affecting large-scale integration.

To program or store data in NOR type flash memory, a program command, a program address, and program data are provided to the flash memory. The program command may indicate the type of operation to be performed on the flash memory, e.g., a program operation. The portion of the flash memory to be programmed is typically erased prior to execution of the programming operation, where erasing sets each erased memory cell to a first predetermined value, e.g., logic high or "1". The program address and program data may select memory cells to be programmed responsive to the program command. For instance, the program address may activate a word line and the program data may indicate which memory cell(s) coupled to the activated word line will be programmed. Typically a programming operation programs a second predetermined value, e.g., logic low or "0," to each selected memory cell and maintains the erased first predetermined value otherwise.

The flash memory internally designates a preset time for the completion of each programming operation. The program operation includes a verify operation for determining whether the program data is successfully programmed in each addressed memory cell. During the preset time, the programming and verify operations are repeated until the program data is programmed in each addressed memory cell.

To execute the programming operation, a program voltage corresponding to each second predetermined program data value (e.g., "0") is applied to each corresponding bit line. Since NOR type flash memory is programmed using channel hot electron injection, typically only 2 to 4 memory cells may be concurrently programmed by the program voltage during a single programming operation. For instance, when four memory cells may be synchronously programmed during a single program operation and when the program data is "1001101111110111", four programming operationsof"1001", "1011", "1111", and "0111" are required even though only four memory cells, e.g., those cells with a corresponding "0" in the program data, are physically being changed by the programming operations.

Therefore, the program time, or the time required to program the program data to the flash memory, is always uniform regardless of whether the program data is a first or second predetermined value.

SUMMARY OF THE INVENTION

An aspect of the present invention is to provide a nonvolatile memory device capable of reducing programming time. The nonvolatile memory device comprises a memory cell array including a plurality of memory cells, each memory cell corresponding to separate portions of program data, a data scanning unit to detect the portions of program data having a first value, and a programming unit to program the memory cells corresponding to the detected portions of the program data responsive to a predetermined number of detections.

BRIEF DESCRIPTION OF THE DRAWINGS

We include the accompanying drawings to provide a further understanding of the invention, and we incorporate them to constitute a part of this specification. The drawings illustrate example embodiments of the present invention and, together with the description, serve to explain principles of the present invention.

DETAILED DESCRIPTION OF PREFERRED EMBODIMENTS

We describe below preferred embodiments of the present invention in more detail with reference to the accompanying drawings. The present invention may, however, be embodied in different forms and should not be construed as limited to the embodiments set forth here. Rather, these embodiments are provided so that this disclosure will be thorough and complete, and will fully convey the scope of the invention to those skilled in the art. Like numerals refer to like elements throughout the specification.

Figure 1:
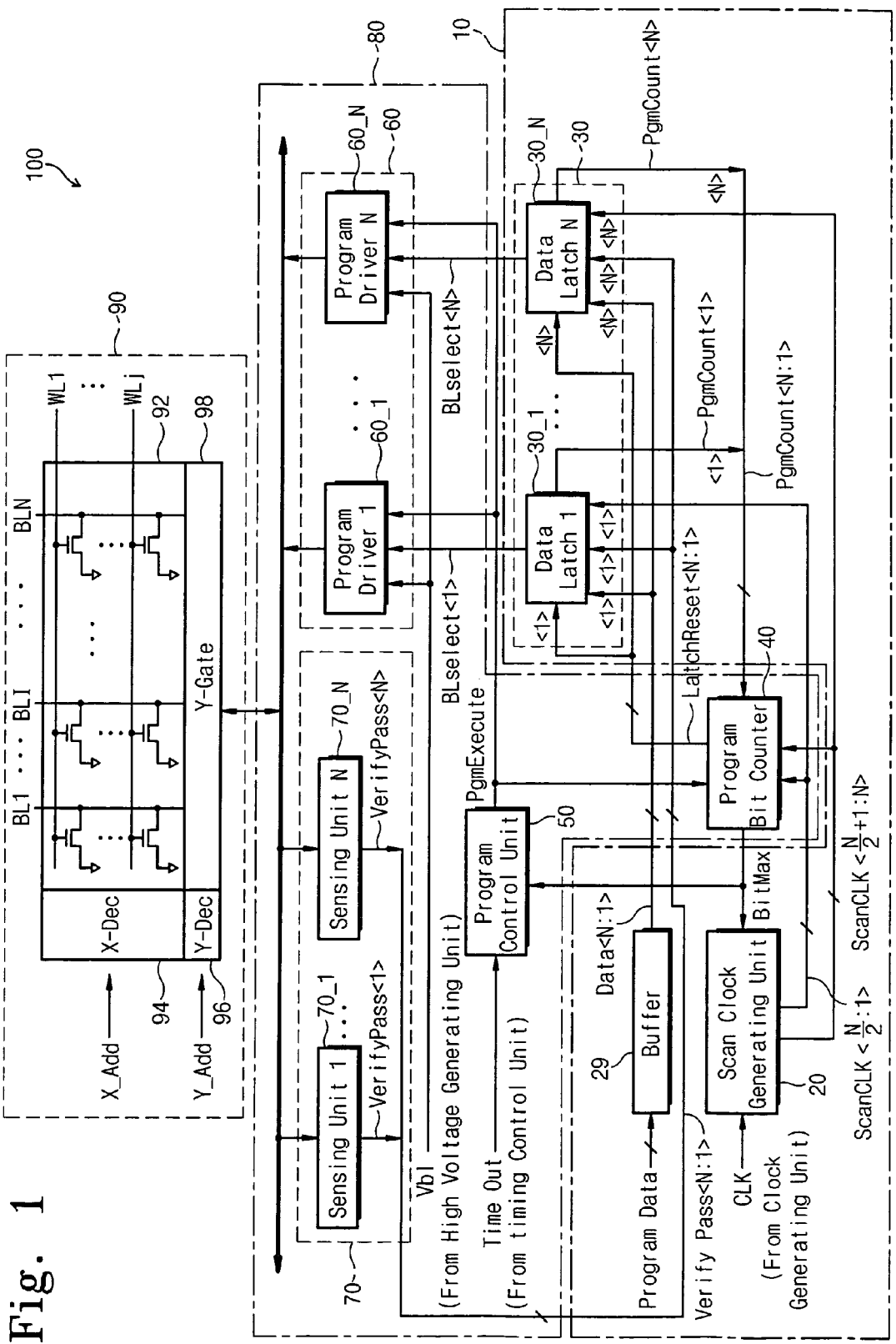
FIG. 1 is a block diagram of a nonvolatile semiconductor memory device in accordance with one exemplary embodiment of the present invention.

FIG. 1 is a block diagram of a nonvolatile semiconductor memory device 100 in accordance with an embodiment of the present invention. Referring to FIG. 1, the nonvolatile memory device 100 comprises a data scanning unit 10, a program unit 80, and a memory cell array region 90.

The memory cell array region 90 includes a memory cell array 92, an X-decoder 94, a Y-decoder 96, and a Y-gate 98. The memory cell array 92 comprises a plurality of memory cells connected to a plurality of bit lines BL1-BLN and a plurality of word lines WL1-WLj. The X-decoder 94 decodes a row address X_Add of a memory cell. The Y-decoder 96 decodes a column address Y_Add of the column. In addition, the Y-decoder 96 performs a data interface between the memory cell array 92 and the program unit 80. Although the semiconductor memory device 100 is shown in FIG. 1 as a NOR type flash memory the present invention may be implemented in other nonvolatile memory types.

Data scanning unit 10 includes a scan clock generating unit 20, a buffer 29, and a data latch unit 30. Scan clock generating unit 20 generates a plurality of scan clock signals ScanCLK<N:1> responsive to an internal clock signal CLK and provides the scan clock signals ScanCLK<N:1> to data latch unit 30 and a program bit counter 40. As shown in FIG. 1, the scan clock signals ScanCLK<N:1> may be provided in two groups ScanCLK $$\text{ScanCLK} < \frac{N}{2}:1>$$

and ScanCLK $$\text{ScanCLK} < \frac{N}{2} + 1:N>.$$

In an embodiment, scan clock signals ScanCLK<N:1> may be generated in an alternating fashion, e.g., ScanCLK<1>, ScanCLK<N>, ScanCLK<2>, ScanCLK<N−1>, etc., with ScanCLK $$\text{ScanCLK} < \frac{N}{2} + 1>$$

as the final scan clock signal generated for each set of program data. The scan clock generating unit 20 may generate two scan clock signals in each interval of the internal clock signal CLK, one when the internal clock signal CLK is at a high level and the other when the internal clock signal CLK is at a low level. The internal clock signal CLK may be generated from a clock generating unit (not shown), which may be included in the semiconductor memory device 100. Buffer 29 buffers a plurality of bits of program data Data <N:1> and provides the buffered program data Data <N:1> to data latch unit 30.

Data latch unit 30 determines which bits of the program data Data<N:1> have a value of "0" responsive to scan clock signals ScanCLK<N:1>, and generates the bit line selection signals BLselect<N:1> and program count signals PgmCount<N:1> corresponding to those bits with a "0" value. Data latch unit 30 comprises a plurality of data latch circuits 30_1-30_N, where each data latch circuit 30_1-30_N receives a corresponding bit of program data Data<N:1> and determines if the bit has a value of "0" responsive to a corresponding scan clock signal ScanCLK<N:1>. Since two or more scan clock signals may be generated in each interval of the internal clock signal CLK, the data latch unit 30 may determine the value of two or more bits of program data in each internal clock signal interval. Each data latch circuit 30_1-30_N generates a program count signal PgmCount<N:1> and sets a bit line selection signal BLselect<N:1> responsive to the determined value of a corresponding bit of program data Data <N:1>. Data latch unit 30 provides the program count signals PgmCount<N:1> to the program bit counter 40 and the bit line selection signals BLselect<N:1> program driver 60.

Program unit 80 programs selected memory cells within memory cell array 90 responsive to the bit line selection signals BLselect <N:1> and the program count signals PgmCount<N:1>. Program unit 80 includes the program bit counter 40, a program control unit 50, the program driver 60, and a sensing unit 70.

Program bit counter 40 receives the program count signals PgmCount<N:1> from the data latch unit 30 and scan clock signals ScanCLK<N:1> from scan clock generating unit 20. Program bit counter 40 generates a synchronous activation signal BitMax responsive to the program count signals PgmCount<N:1> or scan clock signals ScanCLK<N:1>. The synchronous activation signal BitMax may be generated when the last scan clock signal is received or after a predetermined number of program count signals PgmCount<N:1> are counted. For channel hot electron injection programming of NOR type flash memory devices, typically 2 to 4 memory cells may be programmed concurrently, therefore, in an embodiment, the predetermined number of program count signals PgmCount<N:1> may be between 2 and 4. Program bit counter 40 provides the synchronous program activation signal BitMax to a scan clock generating unit 20 and a program control unit 50.

Scan clock generating unit 20 may cease generating the scan clock signals in response to the synchronous program activation signal BitMax. Program control unit 50 generates a program execution signal PgmExecute in response to the synchronous program activation signal BitMax, and provides the program execution signal PgmExecute to program drive unit 60 and program bit counter 40. In an embodiment, the program execution signal PgmExecute is set to a high level responsive to the synchronous program activation signal BitMax, and set to a low level responsive to a program time control signal Time Out generated from a timing control unit (not shown), which may be included in semiconductor memory device 100. The program bit counter 40 may reset itself and generate a latch reset signal LatchReset for resetting each data latch circuit 30_1-30_N in response to a program execution signal PgmExecute.

Program driver 60 programs memory cell array 90 by selectively activating bit lines BL1-BLN responsive to the program execution signal PgmExecute and bit line selection signals BLselect <N:1>. Program driver 60 includes a plurality of program drive circuits 60_1-60_N, each program drive circuit 60_1-60_N corresponding to a bit line BL1-BLN. Each program drive circuit 60_1-60_N receives corresponding bit line selection signals BLselect <N:1>, a program voltage Vb1 from a high voltage generating unit (not shown), which may be included in the semiconductor memory device 100, and the program execution signal PgmExecute. Each program drive circuit 60_1-60_N applies the program voltage Vb1 to a corresponding bit line BL1-BLN when the corresponding bit line selection signal Blselect<N:1> is set to a high level by data latch unit 30.

Sensing unit 70 includes a plurality of sensing circuits 70_1-70_N, where each sensing circuit 70_1-70_N carries out a verify operation that reads data from a corresponding bit line BL1-BLN of the memory cell array 92 to confirm completed programming by program driver 60. Each sensing circuit 70_1-70_N sets a corresponding verify pass signal VerifyPass<N:1> to a high level when the corresponding memory cell is confirmed to be programmed as a result of the verify operation indicating a verify pass to the corresponding data latch circuits 30_1-30_N. When the corresponding memory cell is determine not to be programmed, each of the sensing circuits 70_1-70_N sets a corresponding verify pass signal VerifyPass<N:1> to a low level indicating a verify fail to the corresponding data latch circuits 30_1-30_N.

In an embodiment, each sensing circuit 70_1-70_N may include a comparator (or a comparing logic) that compares the data read from the corresponding bit line of the memory cell array 92 with the data programmed by each program drive circuits 60_1-60_N. When a result from a corresponding comparator indicates the data is the same, a corresponding verify pass signal VerifyPass<N:1> is provided to the corresponding data latch circuits 30_1-30_N.

If the results are different, each corresponding sensing circuit 70_1-70_N sets a corresponding verify pass signal VerifyPass<N:1> to a low level to indicate the programming failed for the corresponding bit line BL1-BLN. Upon reception of a corresponding verify pass signal VerifyPass<N:1> set to a low level, each data latch circuit 30_1-30_N reprograms the program data to the memory cell array 90.

Figure 2:
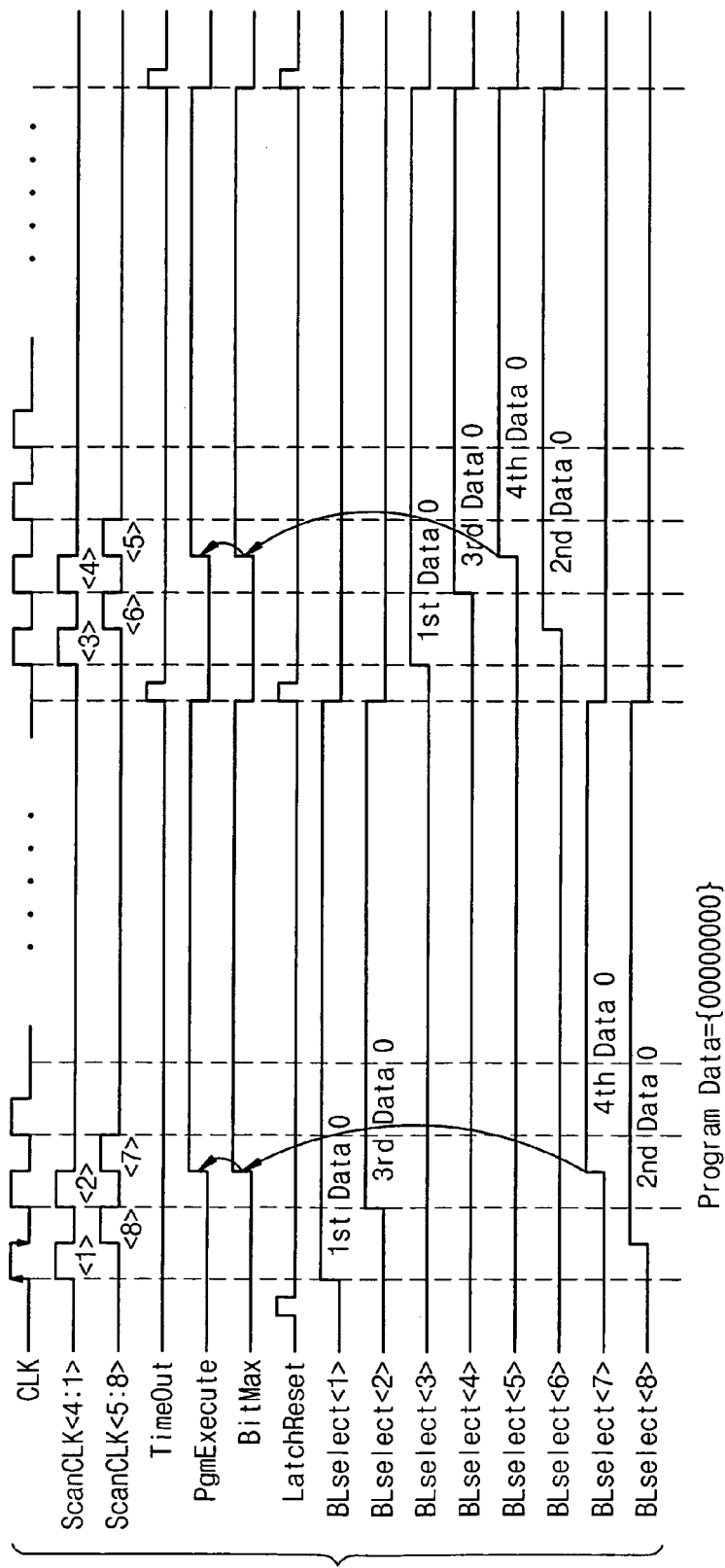
FIGS. 2 and 3 are timing diagrams illustrating the operation of semiconductor memory device shown in FIG. 1.
Figure 3:
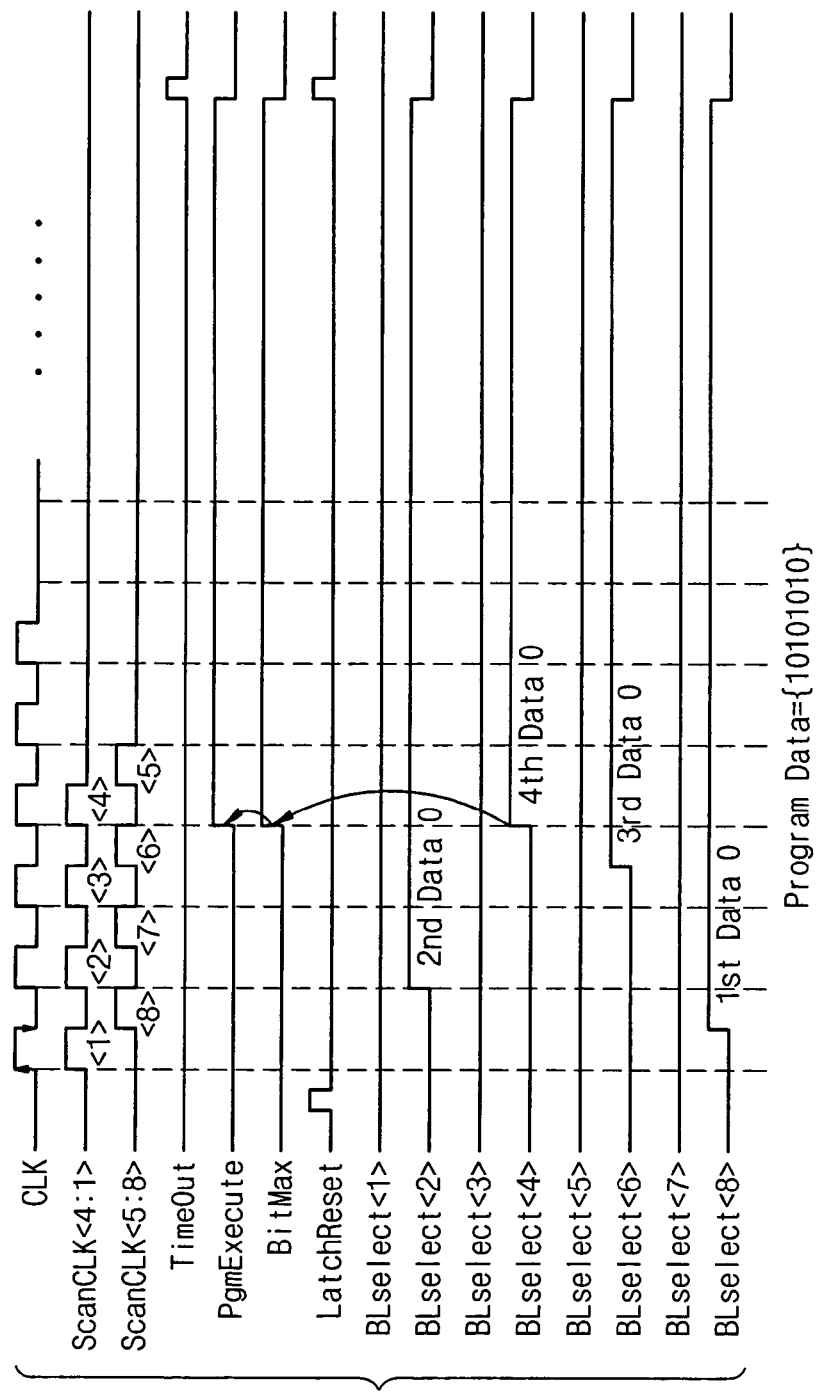

FIGS. 2 and 3 are timing diagrams illustrating the operation of semiconductor memory device 100 in FIG. 1. With reference to FIGS. 2 and 3, assume the program data contains 8 bits and predetermined number of program count signals PgmCount<8:1> needed to generate the synchronous activation signal BitMax is four.

Referring to FIG. 2, the program data Data<8:1> to be programmed to memory cell array region 90 is "00000000". A latch reset signal LatchReset is generated to initialize the data latch circuits 30_1-30_8 for parallel bit scanning, where a first group of scan clock signals ScanCLK<4:1> are used by data latch circuits 30_1-30_4 in a forward scan of the program data and a second group of scan clock signals ScanCLK<5:8> are used by data latch circuits 30_5-30_8 in a reverse scan. In the embodiment shown in FIG. 2, the first group of scan clock signals ScanCLK<4:1> are generated on the rising edges of an internal clock signal CLK, and the second group of scan clock signals ScanCLK<5:8> are generated on the falling edges of the internal clock signals CLK.

The latch reset signal LatchReset is generated by program bit counter 40 after programming unit 80 programs memory cell array 92. After the latch reset signal LatchReset is pulsed, each of the data latch circuits 30_1-30_8 determines the level (high or low) of corresponding bit line selection signals BLselect<8:1> and the program count signals PgmCount<8:1>. In an embodiment, each of the data latch circuits 30_1-30_8 generates an activated bit line selection signal BLselect<i> and an activated program count signal PgmCount<i> when a corresponding program data has a value of "0", and an inactivated bit line selection signal BLselect<i> and an inactivated program count signal PgmCount<i> when the corresponding program data has a value of "1".

When the first and eighth scan clock signals ScanCLK<1> and ScanCLK<8> are generated in a first period of the internal clock signal CLK, program data with a value of "0" (1st Data 0 and 2nd Data 0) is detected by data latch circuits 30_1 and 30_8 and the first and eighth bit line selection signals BLselect<1> and BLselect<8> and the first and eight program count signals PgmCount<1> and PgmCount<8> are generated. The program bit counter 40 increments a counter value twice in response to the first and eight program count signals PgmCount<1> and PgmCount<8>.

Subsequently, second and seventh scan clock signals ScanCLK<2> and ScanCLK<7> are generated in a second period of the internal clock signal CLK. Program data with a value of "0" (3rd data 0 and 4th data 0) is detected in response to the second and seventh scan clock signals ScanCLK<2> and ScanCLK<7>, and the second and seventh bit line selection signals BLselect<2> and BLselect<7> and second and seventh program count signals PgmCount<2> and PgmCount<7> are generated. The program bit counter 40 increments the counter value to four in response to the second and seventh program count signals PgmCount<2> and PgmCount<7>.

Since the counter value is equal to the predetermined number of program count signals, a synchronous program activation signal BitMax is activated to indicate four bits of program data with a value of "0" have been detected and are to be programmed concurrently. When the synchronous program activation signal BitMax is activated, the program control unit 50 activates a program execution signal PgmExecute initiating the programming operation by program unit 80.

As a result, the four bits of program data with a value of "0" Data<1>, Data<2>, Data<7>, and Data<8> are programmed to memory cell array 92 concurrently. While the synchronous program activation signal BitMax is activated, the scan clockgenerating unit 20 does not generate a scan clock. When a program time elapses a program time control signal Time Out is provided to program control unit 50, where the program execution signal PgmExecute is deactivated responsive to the program time control signal TimeOut, and the synchronous program activation signal BitMax is deactivated responsive to the deactivation of the program execution signal PgmExecute. A latch reset signal LatchReset is generated to initialize the program bit counter 20 and the data latch 30, and a programming operation is executed with program data Data<3>, Data<4>, Data<5> and Data<6> in the same manner as describe above.

Referring to FIG. 3, the program data Data<8:1> to be programmed to memory cell array region 90 is "10101010", where the program data Data<2>, Data<4>, Data<6>, and Data<8> have a value of "0". The programming operation illustrated in FIG. 3 is similar to the operation illustrated in FIG. 2, except the second, forth, sixth, and eighth bit line selection signals BLselect<2>, BLselect<4>, BLselect<6>, and BLselect<6> and second, forth, sixth, and eighth program count signals PgmCount<2>, PgmCount<4>, PgmCount<6>, and PgmCount<8> are generated responsive to scan clock signals ScanCLK<2>, ScanCLK<4>, ScanCLK<6>, and ScanCLK<8>, respectively. Since, there are only four "0" valued bits in the FIG. 3 program data, a second programming operation is not required to program the FIG. 3 program data to memory cell array 92.

Thus, compared to the prior art that executes a programming operation by unconditionally dividing a program data of N bits (e.g., 8 bits) by the number of bits capable of being programmed concurrently (e.g., four bits), the present invention reduces the program time in half by scanning for program data with a value of "0" and programming the memory cell array 92 responsive to the results of the scanning. In addition, since the scanning for program data with a value of "0" is performed in parallel, the programming time may be further reduced.

This reduction in programming time increases as the size of the programming data increases. For example, when provided 16-bits of program data, where four bits are capable of being programmed concurrently, one programming operation may be executed when the program data has four or less bits with a value of "0", two programming operations when five through eight "0" bits are present, three programming operations when nine through twelve "0" bits present, four programming operations when thirteen through sixteen "0" bits are present. In other words, up to 75% of the program time may be reduced depending on the number of program data bits with a value of "0". Since the probability of a program data bit having a value of either "0" or "1" is the same, and the average program time reduction may be about 50%.

Figure 4:
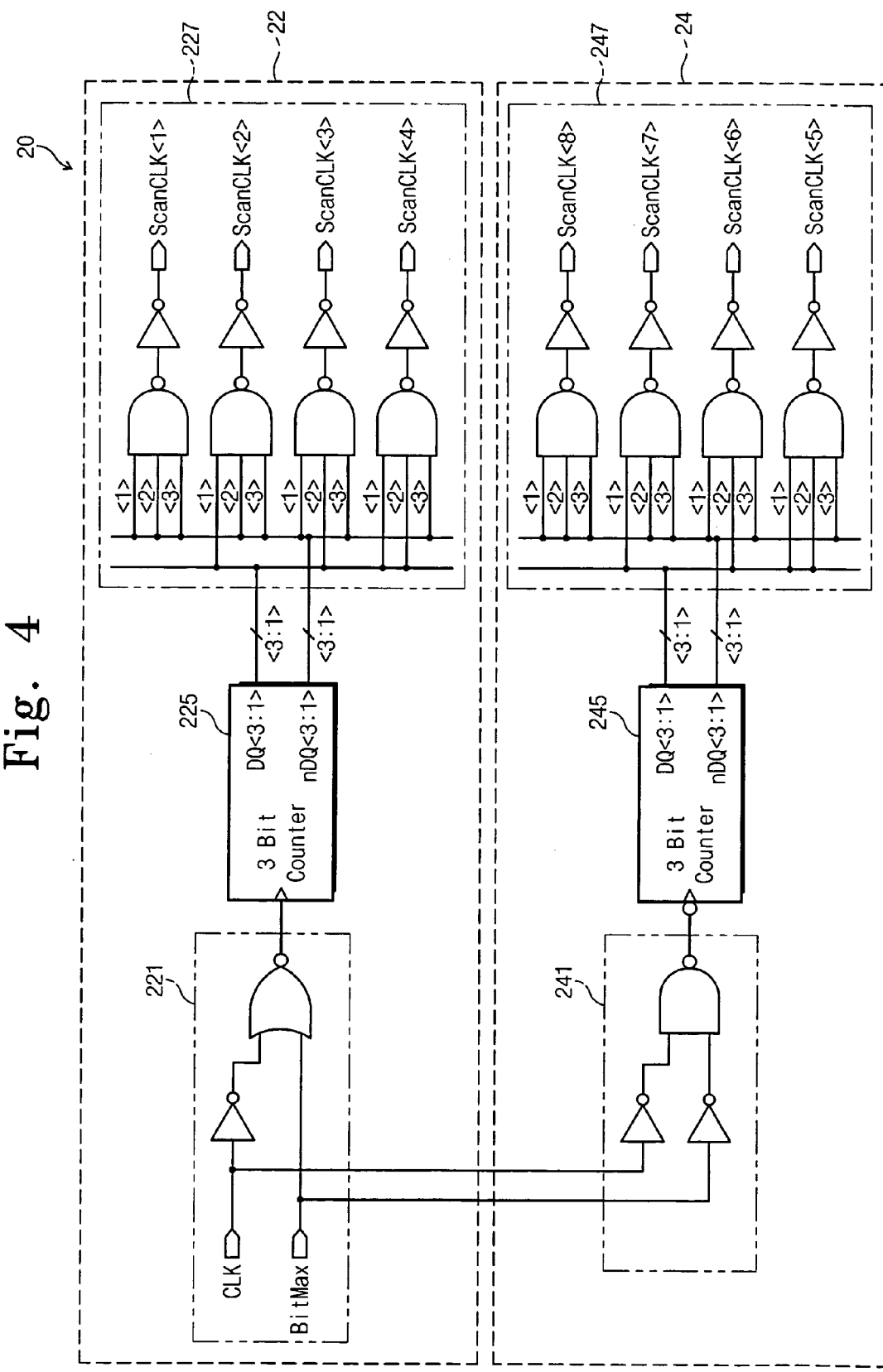
FIG. 4 is a block diagram of an embodiment of the scan clock generating unit shown in FIG. 1.

FIG. 4 is a block diagram of an embodiment of scan clock generating unit 20 in FIG. 1. Referring to FIG. 4, the scan clock generating unit 20 includes a first scan clock generating unit 22 and a second scan clock generating unit 24. A first scan clock generating unit 22 generates four scan clock signals ScanCLK<4:1> and second scan clock generating unit 24 generates four scan clock signals ScanCLK<5:8>. Although FIG. 4 shows an 8 scan clock signal implementation of the scan clock generating circuit 20, the number of scan clock may be may be scaled in other embodiments of clock generating circuit 20.

The first scan clock generating unit 22 includes a signal input unit 221, a counter unit 225, and a decoding unit 227. The signal input unit 221 comprises an inverter to inverter an internal clock signal CLK, and a NOR gate to perform a logical NOR operation with respect to an inverted value of the internal clock signal CLK and a synchronous program activation signal BitMax. The signal input unit 221 provides the internal clock signal CLK to the counter unit 225 when the synchronous program activation signal BitMax is at a low level, and provides an inverted synchronous program activation signal BitMax when the synchronous program activation signal BitMax is at a high level. The counter unit 225 comprises three-bit counter, and counts a clock signal received from the signal input unit 221, where the clock signal may be the internal clock signal or the inverted synchronous program activation signal BitMax. The decoding unit 227 decodes an output of the counter unit 225 to sequentially generate a plurality of scan clock signals ScanCLK<1:4>.

The signal input unit 221 provides a low level clock signal CLK to counter unit 225 responsive to a high level synchronous program activation signal BitMax, thereby prohibiting a counting operation of the counter unit 225. As a result, the first scan clock generating unit 22 stops generating the scan clock signals ScanCLK<1:4> when the synchronous program activation signal BitMax is at a high level. In an embodiment, the synchronous program activation signal BitMax is set to a high level during a program operation by program unit 80. The first scan clock generating unit 22 begins to count the clock signal after the program operation is complete and the synchronous program activation signal BitMax is set to a low level.

Figure 5:
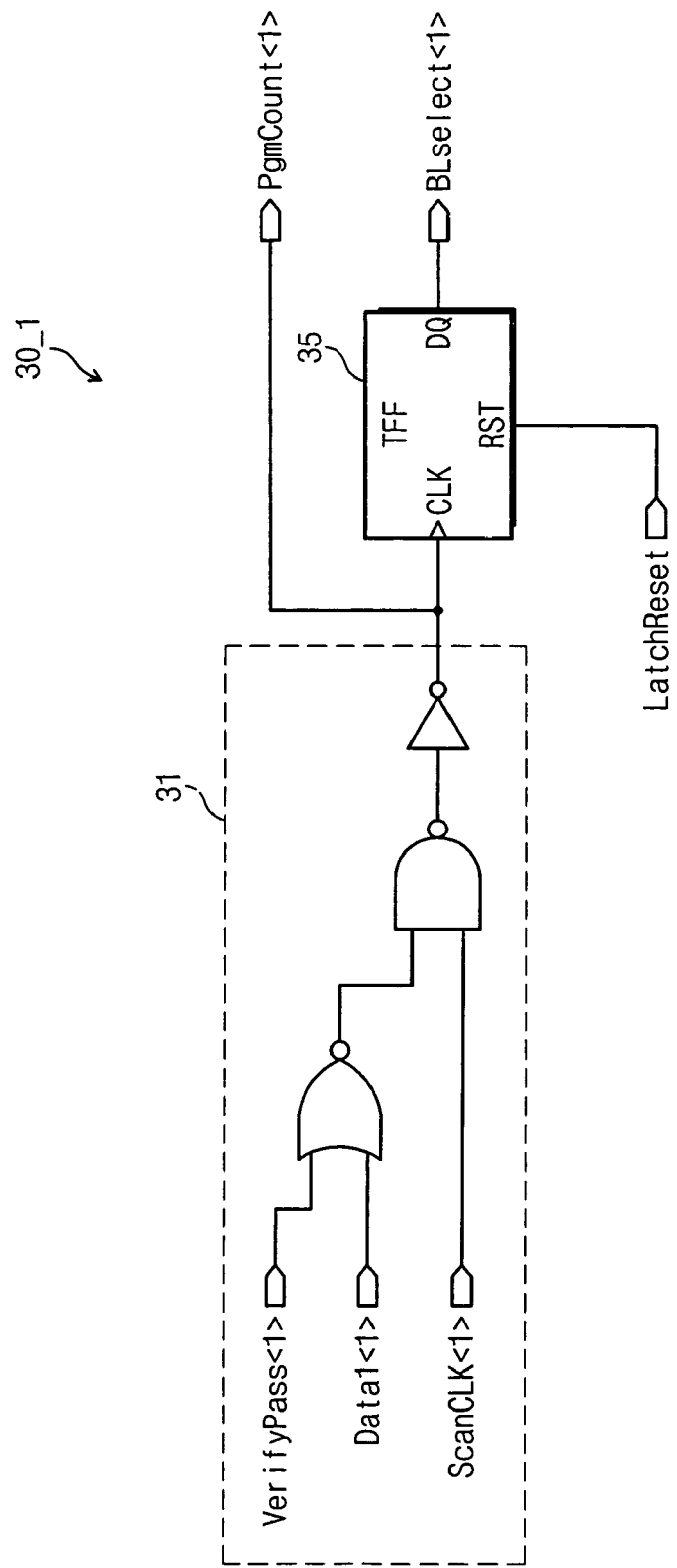
FIG. 5 is a block diagram of an embodiment of the data latch circuit shown in FIG. 1.

The second scan clock generating unit 24 includes a signal input unit 241, a counter unit 245, and a decoding unit 247. The second scan clock generating unit 24 is similar to the first scan clock generating unit 22 except that the counter unit 245 receives an inverted internal clock signal CLK when the synchronous program activation signal BitMax is set to a low level. The addition of a high level synchronous program activation signal BitMax to second scan clock generating unit 24 stalls the generation of scan clock signals Scan CLK<5:8>. Due to these organizations of the counter parts 225 and 245, the first scan clock generating unit 22 generates scan clock signals ScanCLK<1:4> on the rising edges of the internal clock signal CLK, and the second scan clock generating unit 24 generates scan clock signals ScanCLK<5:8> on the falling edges of the internal clock signal CLK. FIG. 5 is a block diagram of an embodiment of the data latch circuit 30_1 in FIG. 1. Referring to FIG. 5, the data latch circuit 30_1 includes a data detecting unit 31 and a data storing unit 35. Data latch circuits 30_2-30_N perform similarly to data latch circuit 30_1. The data detecting unit 31 comprises a NOR gate, a NAND gate, and an inverter. The data detecting unit 31 performs a logical NOR operation with respect to a verify pass signal VerifyPass<1> and a program data Data<1>, and a logical NAND operation with respect to the result of logic NOR operation and a scan clock signal ScanCLK<1>. The data detecting unit 31 inverts the result of the logic NAND operation to output the program count signal PgmCount<1>. For example, when a programming operation properly executed as indicated by a high level verify pass signal VerifyPass<1>, data detecting unit 31 outputs a low level program count signal PgmCount<1>. When a programming operation is not properly executed and program data Data<1> requires reprogramming a low level verify pass signal VerifyPass<1> is provided to data detecting unit 31. For instance, when the value of the program data Data<1> is "0", program count signal PgmCount<1> is generated in synchronization with scan clock signal ScanCLK<1>.

Figure 6:
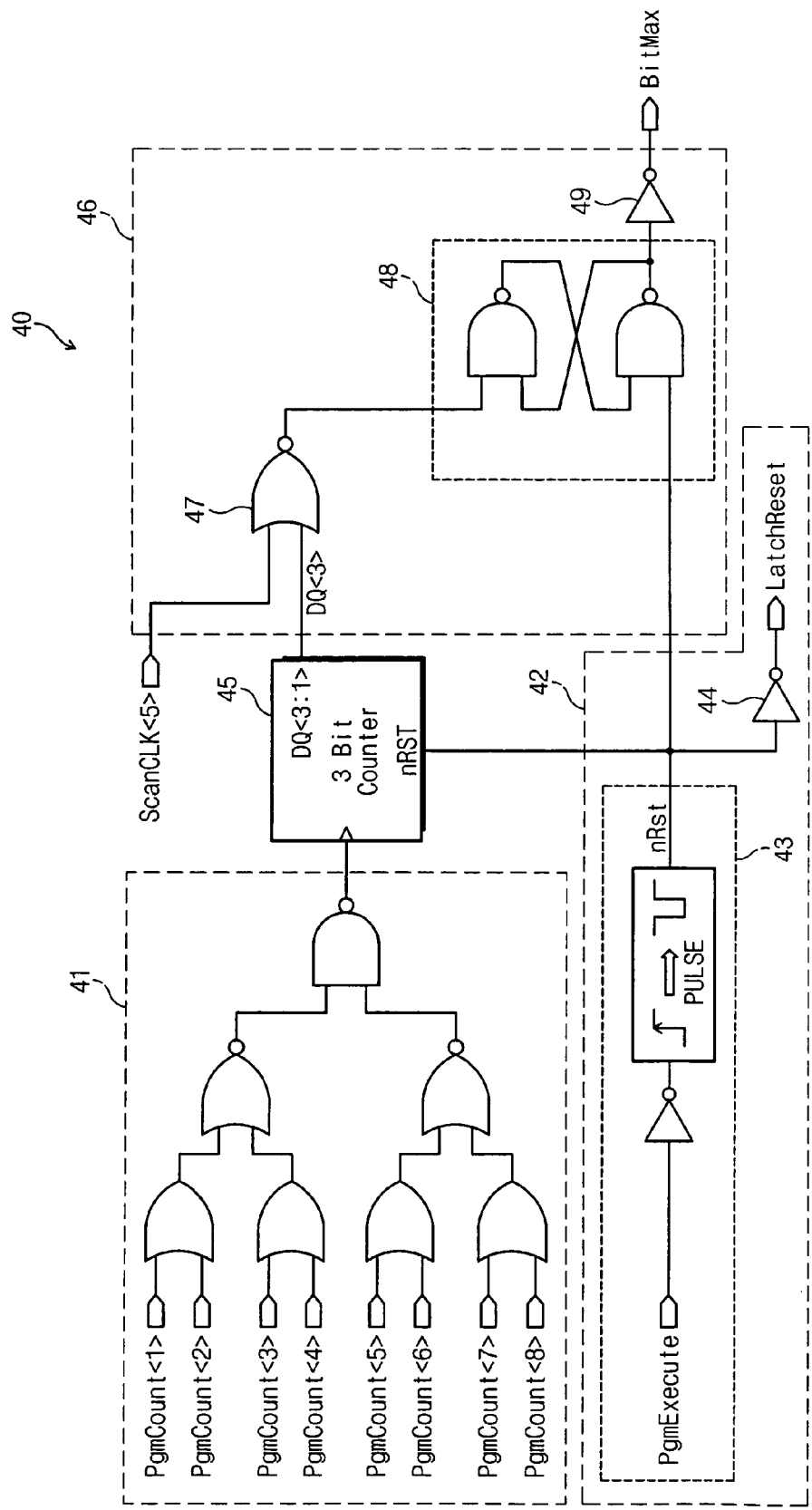
FIG. 6 is a block diagram of an embodiment of the program bit counter shown in FIG. 1.

The data storage unit 35 may comprise a T flip flop to store data. When program data Data<1> with a value of "0" is detected by the data detecting unit 31, the program count signal PgmCount<1> is set to a high level, and the data storage unit 35 sets the bit line selection signal BLselect<1> to a high level. The data storage unit 35 is initialized in response to a latch reset signal LatchReset generated by the program bit counter 40, where the initialization sets the bit line selection signal BLselect<1> to a low level preventing inadvertent programming during the subsequent programming operation. FIG. 6 is a block diagram of an embodiment of the program bit counter 40. Referring to FIG. 6, the program bit counter 40 includes a signal input unit 41, a reset control unit 42, a counter unit 45, a data output unit 46.

The signal input unit 41 receives a plurality of count signals PgmCount<1> through PgmCount<8> generated by data latch unit 30. When data latch unit 30 detects a "0" value in the program data, signal input unit 41 provides a signal to counter unit 45. The counter unit 45 may include a three-bit counter to increment a counter value responsive to the reception of each count signal PgmCount<1> through PgmCount<8> by input unit 41.

The data output unit 46 generates a synchronous program activation signal BitMax responsive to the counter value equaling a predetermined value, or the reception of last scan clock signal, e.g., ScanCLK<5>. To generate the synchronous program activation signal BitMax, the data output unit 46 includes a NOR gate 47 for executing a logical NOR operation with respect to the output of the counter unit 45 and the last scan clock signal ScanCLK<5>, a latch unit 48 for latching an output signal of the NOR gate 47, and a first inverter 49 for inverting and outputting the output of the latch unit 48.

The reset control unit 42 resets the counter unit 45, and generates a latch reset signal LatchReset responsive to a program execution signal PgmExecute generated by program control unit 50. The reset control unit 42 includes a pulse generating unit 43 for transforming an inverted program execution signal PgmExecute into a pulse signal, and an inverter 44 for generating the latch reset signal LatchReset by inverting the pulse signal.

Figure 7:
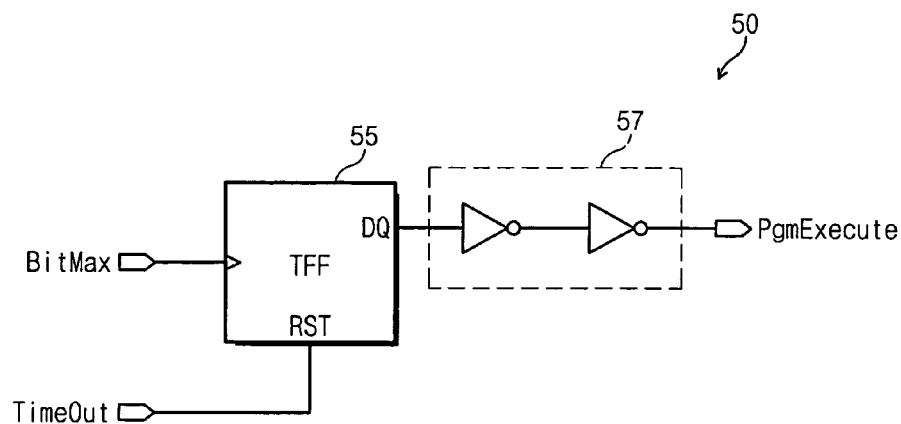
FIG. 7 is a block diagram of an embodiment of the program control unit shown in FIG. 1.

FIG. 7 is a block diagram of an embodiment of the program control unit 50 illustrated in FIG. 1. Referring to FIG. 7, the program control unit 50 includes a toggling unit 55 and a signal output unit 57.

The toggling unit 55 may comprise a T-flip flop to receive a synchronous program activation signal BitMax through a clock input terminal. When the synchronous program activation signal BitMax is set to a high level by program bit counter 40, the toggling unit 55 generates a program execution signal PgmExecute. A signal output unit 57 delays and outputs the program execution signal Pgmexecute generated by the toggling unit 55. In an embodiment, signal output unit 57 delays the program execution signal Pgmexecute by inverting the program execution signal Pgmexecute twice.

The toggling unit 55 may be reset in response to a program time control signal Time Out received at a reset terminal. As a result, the program execution signal PgmExecute is set to a low level.

Figure 8:
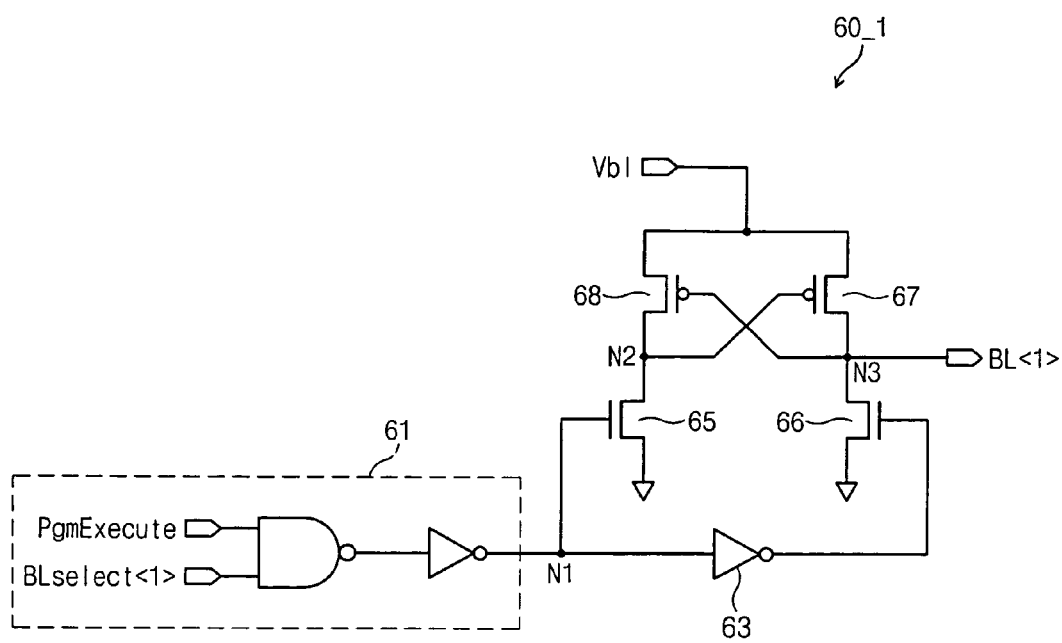
FIG. 8 is a block diagram of an embodiment of the program drive circuit shown in FIG. 1.

FIG. 8 is a block diagram of an embodiment of the program drive circuit 60_1 illustrated in FIG. 1. The program drive circuit 60_1 to selectively apply a bit line voltage Vb1 used to program memory cell array 92. In an embodiment, the program drive circuit 60_1 applies a high voltage Vb1 to program to bit line BL<1> during a programming operation when bit line BL<1> is selected by the bit line selection signal BLselect<1>. Program drive circuits 60_2-60_N operate similarly to program drive circuit 60_1.

Referring to FIG. 8, the program drive circuit 60_1 comprises an input data unit 61 to provide a high level signal to node N1, when the program execution signal PgmExecute and the bit line selection signal BLselect<1> are at a high level. Data input unit 61 may comprise a NAND gate and an inverter to detect the levels of the program execution signal PgmExecute and the bit line selection signal BLselect<1>. The high level signal is applied to a control gate of the first NMOS transistor 65, and is inverted to a low level through an inverter 63 to be sent to a control gate of a second NMOS transistor 66.

The first NMOS transistor 65 is turned on by the high level signal and the second NMOS transistor 66 is turned off by a signal of low level. The voltage level of the second node N2 is lowered to a ground level by a discharge operation resulting from the first NMOS transistor 65 turning on. As the voltage of the second node N2 is lowered to a ground level, a low level signal is applied to a control terminal of a first PMOS transistor 67, thus turning on the first PMOS transistor 67.

The voltage level of the third node N3 rises to a program voltage level Vb1 in a charging operation of the turned-on first PMOS transistor 67, and a second PMOS transistor 68 remains off due to the rising third node N3 voltage. As a result, the program voltage Vb1 at the third node N3 is provided to bit line BL<1>, and used to program a corresponding memory cell.

As described above, the nonvolatile memory device 100 according to an embodiment of the present invention selects only the program data with a value of "0" and programs the memory cell array responsive to the selections. The nonvolatile memory device 100, therefore, reduces programming time drastically, compared to a conventional programming methods.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

I claim the following:

1. A nonvolatile memory device comprising:
    a memory cell array including a plurality of memory cells;
    a data scanning unit configured to generate a plurality of scan clock signals in synchronization with an internal clock of a specific period, and configured to detect program data having a first value by simultaneously scanning separate areas of the program data in response to the scan clock signals; and
    a programming unit to program the program data into the plurality of memory cells responsive to the data scanning unit.

2. The device of claim 1 where the data scanning unit is adapted to scan the program data a predetermined number of times.

3. The device of claim 1 where the programming unit is adapted to program the memory cells responsive to a scan clock signal.

4. The device of claim 1 where the data scanning unit is adapted to detect the program data having the first value by performing a forward scan and an inverse scan of the program data concurrently.

5. The device of claim 1 where the data scanning unit is adapted to generate at least two scan clock signals in each period of an internal clock.

6. The device of claim 3 where the data scanning unit is adapted to stall the generation of the scan clock signals responsive to the programming of the memory cells.

7. The device of claim 1
    where the data scanning unit is adapted to generate a bit line activation signal responsive to each detection; and
    where the programming unit is adapted to program the memory cells corresponding to the bit line activation signals responsive to a predetermined number of detections.

8. The device of claim 1
    where the data scanning unit is adapted to generate a synchronization signal responsive to each detection;
    where the programming unit includes a counter to increment a counter value responsive to each synchronization signal; and
    where the programming unit is adapted to program the memory cells corresponding to the detected program data responsive to the counter value.

9. The device of claim 8 where the data scanning unit is adapted to stall the detection of portions of the program data having the first value responsive to the counter value.

10. The device of claim 8 where the counter is adapted to reset the counter value responsive to the programming of the memory cells.

11. The device of claim 1 where the programming unit includes a sensing unit to verify the programming of the memory cells.

12. The device of claim 11 where the sensing unit verifies the programming by reading data stored in the memory cells corresponding to the program data and comparing the stored data with the program data.

13. A method comprising:
   storing program data in a buffer;
   generating at least two csan clock signals in each period of an internal clock;
   detecting a first value by simultaneously scanning separate areas of the program data in the buffer responsive to the scan clock signals; and
   programming the memory cells responsive to the detecting.

14. The method of claim 13 including detecting the first value a predetermined number of times.

15. The method of claim 13 where programming the memory cells is performed responsive to the scan clock signals.

16. The method of claim 13 comprising performing a forward scan and an inverse scan of the program data concurrently.

17. The method of claim 13 comprising stalling the generating of the scan clock signal responsive to the programming.

18. The method of claim 13 comprising
   generating a bit line activation signal responsive to each detection; and
   programming the memory cells corresponding to the bit line activation signals responsive to a predetermined number of detections.

19. The method of claim 13 comprising
   generating a synchronization signal responsive to the detecting;
   incrementing a counter value responsive to each synchronization signal; and
   programming the memory cells corresponding to the program data responsive to the counter value.

20. The method of claim 19 comprising stalling the scanning responsive to the counter value.

21. The method of claim 19 comprising resetting the counter value responsive to the programming.

22. The method of claim 14 comprising verifying the programming.

23. The method of claim 22 where verifying the programming includes:
   reading data stored in the memory cells corresponding to the program data; and
   comparing the read data with the program data.

* * * * *

UNITED STATES PATENT AND TRADEMARK OFFICE
CERTIFICATE OF CORRECTION

PATENT NO. : 7,379,372 B2 Page 1 of 1
APPLICATION NO. : 11/181163
DATED : May 27, 2008
INVENTOR(S) : Jae-Yong Jeong It is certified that error appears in the above-identified patent and that said Letters Patent is hereby corrected as shown below:

Column 2, lines 12-13, the words "operationsof"1001"," should read -- operations of "1001", --;
Column 11, line 7, the word "csan" should read -- scan --.

Signed and Sealed this

Twenty-fifth Day of November, 2008

JON W. DUDAS
*Director of the United States Patent and Trademark Office*